(12) United States Patent
Arai et al.

(10) Patent No.: US 8,828,500 B2
(45) Date of Patent: Sep. 9, 2014

(54) PHOTOCURABLE RESIN COMPOSITION FOR SEALING ORGANIC EL DEVICE

(75) Inventors: Yoshihide Arai, Tokyo (JP); Hiromasa Kitazawa, Tokyo (JP); Kenichi Horie, Tokyo (JP)

(73) Assignee: Three Bond Co., Ltd., Tokyo (JP)

( * ) Notice: Subject to any disclaimer, the term of this patent is extended or adjusted under 35 U.S.C. 154(b) by 174 days.

(21) Appl. No.: 12/614,187

(22) Filed: Nov. 6, 2009

(65) Prior Publication Data

US 2010/0137530 A1 Jun. 3, 2010

(30) Foreign Application Priority Data

Nov. 28, 2008 (JP) ................................ 2008-305666

(51) Int. Cl.
| | |
|---|---|
| C08L 63/00 | (2006.01) |
| G03F 7/075 | (2006.01) |
| G03F 7/038 | (2006.01) |
| C08G 59/22 | (2006.01) |
| C08G 59/68 | (2006.01) |
| C09J 163/00 | (2006.01) |
| H01L 51/52 | (2006.01) |

(52) U.S. Cl.
CPC ........... *C08G 59/226* (2013.01); *H01L 51/5246* (2013.01); *C08L 63/00* (2013.01); *G03F 7/0751* (2013.01); *C08G 2650/56* (2013.01); *G03F 7/038* (2013.01); *C08G 59/68* (2013.01); *C09J 163/00* (2013.01)
USPC ............. 427/518; 522/67; 522/163; 522/168; 522/178; 522/181; 522/170; 427/508; 427/510; 427/515; 427/516; 427/517; 156/60; 156/349; 156/379.6

(58) Field of Classification Search
USPC ................ 522/170, 168, 25, 31, 178, 181, 67; 522/162; 427/508, 510, 515, 516, 517, 518; 156/60, 349, 379.6
See application file for complete search history.

(56) References Cited

U.S. PATENT DOCUMENTS 4,401,537 A * 8/1983 Chern et al. ..................... 522/31
4,412,048 A * 10/1983 Dixon et al. .................. 428/414

FOREIGN PATENT DOCUMENTS

| | | |
|---|---|---|
| JP | A 3-37991 | 2/1991 |
| JP | A 3-261091 | 11/1991 |
| JP | A 4-212284 | 8/1992 |
| JP | A 4-363890 | 12/1992 |
| JP | A 5-36475 | 2/1993 |
| JP | A 5-89959 | 4/1993 |
| JP | A 5-129080 | 5/1993 |
| JP | A 9-176413 | 7/1997 |
| JP | A 9-235357 | 9/1997 |
| JP | A 10-135255 | 5/1998 |
| JP | A 11-274377 | 10/1999 |
| JP | A 2001-237064 | 8/2001 |
| JP | A 2003-277628 | 10/2003 |
| JP | A 2004-59718 | 2/2004 |
| JP | A 2004-115650 | 4/2004 |
| JP | A 2004-139977 | 5/2004 |
| JP | A 2004-210901 | 7/2004 |
| JP | A 2004-292594 | 10/2004 |
| JP | A 2004-315688 | 11/2004 |
| JP | A 2005-19269 | 1/2005 |
| JP | A 2005-129520 | 5/2005 |
| JP | A 2005-216856 | 8/2005 |
| JP | A 2005-302401 | 10/2005 |
| JP | 2005-336314 | 12/2005 |
| JP | 2006179318 A * | 7/2006 |
| JP | A 2006-179318 | 7/2006 |
| JP | 2007112956 A * | 5/2007 |
| JP | A 2007-284475 | 11/2007 |
| JP | A 2008-59945 | 3/2008 |
| WO | WO 02/06399 A1 | 1/2002 |
| WO | WO 2005/019299 A1 | 3/2005 |
| WO | WO 2007049385 A1 * | 5/2007 |

* cited by examiner

*Primary Examiner* — Sanza McClendon
(74) *Attorney, Agent, or Firm* — Greer Burns & Crain Ltd.

(57) ABSTRACT

A photocurable resin composition for sealing an organic EL device is provided, which can seal the organic EL device without exerting any bad influence on the device, thereby suppress the formation and growth of dark spots positively, and which can ensure a high transmittance of light, thereby maintain a stable light emitting characteristic over a long period of time. The composition comprises (A) an epoxy resin containing at least two glycidyl groups in each molecule thereof and having a molecular weight of 200 to 7000, (B) an epoxy resin containing at least one glycidyl group in each molecule thereof and having a molecular weight of 20000 to 100000, (C) a latent acid photo catalyst adapted to be activated and produce an acid upon being irradiated with energy beam, and (D) a silane coupling agent containing a glycidyl group in each molecule thereof, the composition exhibiting non-fluidity at 25° C., but exhibiting fluidity in a temperature range of 50° to 100° C.

11 Claims, No Drawings

PHOTOCURABLE RESIN COMPOSITION FOR SEALING ORGANIC EL DEVICE

FIELD OF THE INVENTION

The present invention relates to a photocurable resin composition to be used for sealing an organic electroluminescence (EL) device which emits light at a high luminance upon application thereto of an electric field. More particularly, the present invention is concerned with a photocurable resin composition which is formed to cover the whole surface of an organic EL device formed on a substrate in order to protect the organic EL device from moisture, etc.

BACKGROUND OF THE INVENTION

The organic EL device is a polycrystalline semiconductor device and, since it can emit light of a high luminance at a low voltage, it is used, for example, as backlight of a liquid crystal and is expected as a thin flat display device. However, the organic EL device has drawbacks. It is extremely weak against moisture. For example, the interface between a metal electrode and an organic EL layer peels off under the influence of moisture, the metal is oxidized and becomes high in resistance, and the organic substance itself changes in quality due to moisture, with consequent failure to emit light and lowering of luminance.

To solve such problems there have been proposed a method of molding the organic EL device with acrylic resin (JP 3-37991A), a method of shielding the organic EL device within a hermetically sealed case with $P_2O_5$ sealed therein (JP 3-261091A), a method of providing the organic EL device with a protective film such as a metal oxide and then hermetically sealing the device with use of a glass plate or the like (JP 4-212284A), a method of forming a plasma polymerization film and a photocurable resin layer on the organic EL device (JP 5-36475A), a method of storing the organic EL device in an inert liquid comprising a fluorinated carbon (JP 4-363890A), a method of forming a protective film such as an inorganic oxide on the organic EL device and then bonding a polyvinyl alcohol-applied glass plate onto the protective film through an epoxy resin (JP 5-89959A), and a method of sealing the organic EL device into liquid paraffin or silicone oil (JP 5-129080A). Recently, moreover, there has been proposed a method of adding a moisture absorbing material into a sealing resin and then laminating the sealing resin onto the organic EL device to protect the device from the influence of moisture.

However, all of the above conventional organic EL device sealing methods are unsatisfactory. For example, with a mere sealing of the device into a hermetically sealed structure together with a moisture absorbing agent, it is impossible to suppress the formation and growth of dark spots derived from the entry of oxygen and moisture. In the method of storing the device within a fluorinated carbon or silicone oil, not only the sealing step becomes complicated due to going through a liquid sealing step, but also an increase in the number of dark spots cannot be prevented to a perfect extent. Rather, there arises the problem that the liquid gets into the interface between a cathode and the organic layer, promoting the peeling of the cathode. Also in case of adding a moisture absorbing material to resin, there is a fear that the resin may absorb moisture before sealing, and thus the handleability is poor. Besides, there has been a case where, due to the absorption of moisture, the resin itself swells and cause peeling (JP 2007-284475A). There also has been proposed a method wherein, in order to eliminate a bad influence of moisture on the organic EL device, a moistureproof layer is formed separately from the sealing layer by adding a moisture absorbing agent comprising a metal oxide such as barium oxide or calcium oxide to a photocuring epoxy layer (JP 2001-237064A). In this case, the metal oxide mixed into the resin swells due to moisture and therefore, as the case may be, the organic EL device itself is destroyed.

In JP 2005-19269A, JP 2005-302401A and JP 2006-179318A there is introduced a technique for sealing an organic EL device wherein an organic EL device is formed on a glass substrate with use of a thermosetting resin composition, a resin composition is stacked so as to cover the whole surface of the organic EL layer, followed by lamination of a water impermeable glass substrate. In this technique, however, when effecting the lamination using the thermosetting resin composition described therein, there arise, under the influence of heat for curing the resin composition and the heat of reaction of the resin composition itself, the problem of deterioration of the organic EL device and the problem of peeling of a cathode from the organic layer caused by a stress strain at the time of curing. In case of epoxy resin being cured with an amine curing agent, there arise the problem of corrosion of the organic EL device through pin holes in a protective film and the problem of a lowering of transmittance of light caused by coloration of a cured composition.

To solve the problems related to the use of such a thermosetting resin composition, JP 2004-139977A introduces a technique for sealing an organic EL device with use of a photocurable resin composition comprising an acryl functional resin. However, the resin composition comprising an acryl functional resin has a drawback such that a chemical influence thereof on the organic EL device is serious and that a portion not irradiated with light is difficult to cure. In WO 05/019299 there is disclosed a formulation using an energy beam curing resin composition which comprises an epoxy functional resin. The sealing structure disclosed therein is a conventional hollowing sealing structure, which requires the use of a desiccant to ensure reliability, and with an optical loss being unavoidable because of a hollow structure. JP 2005-129520A describes the use of a flexible transparent sealing material. However, without bonding to a device interface, it is difficult to ensure a high reliability. In JP 2005-216856A it is described that a sealing layer containing a nanocomposite which comprises a layered inorganic material, a polymer and a curing agent is used for filling. According to the technique described therein, an applicable, thin film desiccant is formed from a conventional laminating type desiccant to ensure reliability. Thus, there is no bonding function for both upper and lower substrates, but it is required to separately provide a sealing or filling material to fill up a gap between both upper and lower substrates.

On the other hand, in JP 11-274377A there is disclosed a paste composition comprising a thermoplastic resin, an epoxy resin, a coupling agent, a silicon dioxide powder and an organic solvent, and it is described that IC and LSI chips are used for sealing directly. However, in the invention disclosed therein, importance is attached to stress relaxability (elasticity) of a cured composition. Although a description is found therein to the effect that the paste composition is superior in moisture resistance, no consideration is given to the amount of moisture contained in the system of the paste composition. Further, in case of using a two-component curing type epoxy resin, there are required operations for formulation and mixing, as well as associated equipment. Besides, since pot life exists, there has been a problem in point of workability.

In JP 9-176413A is disclosed a method of forming a transparent film with use of a maleic anhydride copolymer as a curing agent. However, it is impossible to effect lamination because the copolymer contains styrene. In JP 9-235357A and 10-135255A, imidazole is used as a curing accelerator together with an acid anhydride curing agent. Also in this case the application thereof to the organic EL device is impossible because of a high curing temperature. In JP 2003-277628A is disclosed a formulation using 2,4-diamino-6-[2'-methylimidazole-(1')]-ethyl-S-triazine isocyanuric acid adduct for the purpose of imparting flame retardancy by the generation of an inert gas in curing. In this formulation system it is impossible to afford a transparent cured composition and so the use for sealing an organic EL panel is impossible. In WO 02/006399 and JP 2004-315688A there is disclosed a system using a phenoxy resin and a bisphenol type epoxy resin. But this system is not practical because of a low visible light transmittance or conspicuous coloration of a cured composition.

In the foregoing sealing method using liquid resin it has been a serious problem that bubbles are formed in the step of laminating the organic EL device and sealing glass to each other. It is very difficult to effect lamination without any bubbles throughout the whole surface of the display portion. The inclusion of bubbles has heretofore been a cause of lowering the life of the device. Moreover, in case of using liquid resin at the time of multichamfering from mother glass, masking is required for a portion not to be laminated, with consequent lowering of workability.

In connection with sealing using a liquid resin composition there is disclosed in JP 2008-59945A a method wherein a photocurable sealing material is applied dotwise at equal intervals throughout the whole surface to be laminated and sealing is done under alignment and gap adjustment. Also in this sealing method it is very difficult to make a uniform thickness control after lamination and the inclusion of bubbles is unavoidable. Besides, because of a low viscosity liquid permitting dot application it is necessary that a damming material of a high viscosity be provided around a substrate in order to suppress the spreading of the photocurable sealing material during lamination. In the case of a sealing material of a low viscosity, there is a fear of influence on the device such as, for example, the formation of dark spots in an initial stage.

In JP 2004-59718A and JP 2004-210901A there is disclosed an adhesive film or a heat-curable resin, using imidazole as a curing agent or a curing accelerator. These are both high curing temperature, causing a great damage to the organic EL device. In JP 2004-115650A is disclosed a formulation using a liquid imidazole compound, but in this system it is impossible to ensure a thermal stability in the coating step of forming into a sheet shape. Further, in JP 2004-292594A is disclosed a formulation comprising an epoxy resin, a phenoxy resin and a curing agent. In connection with this system, however, no reference is made to the fluidization start temperature, the amount of moisture and the amount of outgas generated, and the system is not suitable for use as a whole surface sealing material for the organic EL device.

DISCLOSURE OF THE INVENTION

Object of the Invention

In the conventional method of sealing the organic EL device with use of a conventional organic EL sealing composition, as noted above, the deterioration caused by dark spots of the organic EL device is not suppressed to a satisfactory extent and the light emitting characteristic is unstable. This is a serious drawback as a light source, e.g., backlight of facsimile, copying machine and liquid crystal display, and is also not desirable as a display such as a flat panel display. It is an object of the present invention to solve the above-mentioned problems of the prior art and provide a photocurable resin composition for sealing an organic EL device, which seals the organic EL device without exerting any bad influence on the device to suppress the generation and growth of dark spots and ensure a high transmittance of light, thereby making it possible to maintain a stable light emitting characteristic over a long period.

SUMMARY OF THE INVENTION

According to the present invention, for achieving the above-mentioned object, there is provided a photocurable resin composition comprising as principal ingredients (A) an epoxy resin containing at least two glycidyl groups in each molecule thereof and having a molecular weight of 200 to 7000, (B) an epoxy resin containing at least one glycidyl group in each molecule thereof and having a molecular weight of 20000 to 100000, (C) a latent acid photo catalyst adapted to be activated and produce an acid upon being irradiated with energy beam, and (D) a silane coupling agent containing a glycidyl group in each molecule thereof, the composition exhibiting non-fluidity at 25° C., but exhibiting fluidity on heating in a temperature range of 50° to 100° C. An organic EL device formed on a glass or film substrate and a sealing glass or film are sealed together through the organic EL device sealing photocurable resin composition of the present invention.

More specifically, an organic EL layer comprising a transparent electrode, a hole transporting layer, an organic EL layer and a back electrode is formed on a glass or film substrate, then the photocurable resin composition of the present invention is heat-transferred onto the organic EL layer, and the organic EL layer and a water-impermeable glass or film are laminated together under heating. As the case may be, the photocurable resin composition is heat-transferred onto a water-impermeable glass or film, which is then laminated to a glass or film substrate formed with the organic EL layer. It is preferable that the photocurable resin composition comprising the ingredients (A) to (D) as principal ingredients have a moisture content of lower than 1500 ppm and that, when cured to 20 μm thickness, the amount of outgas produced in the unit of $\mu g/cm^2$ of the cured composition upon standing at 120° C. for 15 minutes be smaller than 1000 ppm.

PREFERRED EMBODIMENTS OF THE INVENTION

The present invention will now be described in more detail. Preferably, the organic EL device sealing structure of the present invention is fabricated in the following manner.

First, a transparent electrode is formed as a film of about 0.1 μm in thickness onto a glass or film substrate. The transparent electrode can be formed, for example, by vacuum deposition or sputtering. In the vacuum deposition method, however, the smoothness of the film surface may be deteriorated by the growth of crystal grains and the lowering of smoothness becomes a cause of dielectric breakdown or non-uniform emission of light in case of application to a thin film EL, so care must be exercised. On the other hand, in the sputtering method, the surface smoothness is good and a preferred result is obtained in case of stacking a thin film device onto the surface. Next, a hole transporting layer and an organic EL layer are formed in this order to a thickness of 0.05

μm onto the transparent electrode. Further, a back electrode is formed to a thickness of 0.1 to 0.3 μm onto the organic EL layer.

Then, with a roll laminator or a vacuum laminator, the photocurable resin composition of the present invention is transferred onto the glass or film substrate having thus gone through the film formation. In this case, the photocurable resin composition of the present invention is spread beforehand into a base film (release film) shape or a sheet shape and the composition thus formed sheet-like is transferred onto the glass or film substrate by means of a roll laminator or a vacuum laminator. In case of adopting the above transfer method, the transfer can be done smoothly if the thickness of the layer of the photocurable resin composition spread over the film is set at 10 to 30 μm. Subsequently, a water-impermeable glass or film is put from above onto the thus-transferred photocurable resin composition, followed by compression-bonding under heating with use of a vacuum laminator to fix the substrate and glass or film to each other temporarily. Thereafter, the photocurable resin composition is cured completely by radiating ultraviolet light thereto. Preferably, after-baking is performed at 70° to 100° C. after the radiation of ultraviolet light in order to accelerate the perfect curing. The photocurable composition of the present invention may be first transferred onto a water-impermeable glass or film, followed by superposition on an organic EL device substrate. For the purpose of improving the reliability of the organic EL device, an organic EL device substrate with the device protected beforehand by an inorganic film and a water-impermeable glass or film substrate may be put one on the other through the photocurable resin composition of the present invention. As examples of the inorganic film as referred to herein are mentioned films of silicon oxide, silicon nitride, and silicon oxynitride. It is also possible to adopt a method wherein the photocurable resin composition of the present invention is transferred onto a water-impermeable glass or film, then is irradiated beforehand with ultraviolet light to accelerate a curing reaction, and in the course of the curing reaction the glass or film substrate is superimposed on the organic EL device substrate. In this case, after-baking may be conducted at 70° to 100° C. to let curing proceed to a perfect extent.

When the thickness of a cured composition layer of the photocurable resin composition of the present invention formed in the above manner is adjusted to 150 μm, the moisture permeability defined by JIS-K-7129 is not more than 500 g/m²×24 hr in an atmosphere of 60° C. and 95% humidity. When the thickness of the cured product is 20 μm, the transmittance of 405 nm light is not less than 90%. Further, in a peeling adhesion test between glass adherends, the composition exhibits an adhesive force of not less than 1.0 MPa. These physical properties could be attained by carrying out the curing process at a lower temperature than in the conventional curing process.

Particularly, in the sealing structure wherein an organic EL device formed on a glass or film substrate and a protective material combined with the said substrate to protect the organic EL device are sealed together using a cured layer of the photocurable resin composition of the present invention, it is suitable that the thickness of the cured layer of the photocurable resin composition be in the range of 1 to 100 μm, more suitably 5 to 25 μm. If the thickness in question is smaller than 1 μm, it becomes difficult to absorb concaves and convexes of the organic EL device formed or bond two plates (glass or film plates) with each other. In the sealing structure wherein the whole surface of an organic EL device formed on a glass or film substrate is sealed using a cured layer of the photocurable resin composition of the present invention, the thickness of the cured layer of the photocurable resin composition is suitably in the range of 1 to 100 μm, more suitably 5 to 25 μm, as is the case with the above. In the present invention, however, since the organic EL device layer can be sealed with only the cured layer of the photocurable resin composition, a film thickness of larger than 100 μm may be ensured in a range which permits ensuring of a 405 nm light transmittance of 90% or more.

In the photocurable resin composition of the present invention, as preferred examples of the ingredient (A), i.e., the epoxy resin containing glycidyl groups in each molecule thereof, are mentioned such epoxy resins as bisphenol A type epoxy resin, bisphenol F type epoxy resin, hydrogenated bisphenol A/F type epoxy resin, and phenol novolak type epoxy resin. Above all, those having a low chlorine ion content, more specifically, those having a hydrolysable chlorine ion content of lower than 500 ppm, are particularly preferred. More concrete examples are EPICLON EXA-835LV (a product of Dainippon Ink And Chemicals, Incorporated) and Epikote 152 (a product of jER Co.), which are low in chlorine ion content.

As preferred examples of the ingredient (B) used in the present invention, i.e., an epoxy resin containing at least one glycidyl group in each molecule thereof and having a molecular weight of 20000 to 100000, are mentioned such epoxy resins as solid bisphenol A type epoxy resin, solid bisphenol F type epoxy resin, and phenoxy resin. Above all, in case of forming the photocurable resin composition in a sheet shape, the use of phenoxy resin is particularly preferred because it is easy to ensure a required film strength. Epikote 1256 (a product of jER Co.) is mentioned as a concrete example. A preferred amount of the ingredient (B) to be added is 30 to 150 parts by weight, more preferably 50 to 100 parts by weight, based on 100 parts by weight of the ingredient (A). If the amount is smaller than 30 parts by weight, it will become difficult to retain the shape when formed in a sheet shape. On other hand, if the amount exceeds 150 parts by weight, the sheet when so formed becomes hard and fragile, with consequent deterioration of workability, further, the crosslinking density will become lower, thus giving rise to the problem that it is no longer possible to ensure reliability.

As examples of the latent acid photo catalyst (C) used in the present invention and adapted to be activated and produce an acid upon being irradiated with energy beam there are mentioned onium salts such as aromatic diazonium, aromatic halonium and aromatic sulfonium. The ingredient (C) functions as a curing agent for the ingredients (A) and (B). The amount of the ingredient (C) to be added is preferably 0.1 to 10 parts by weight, more preferably 1.5 to 5 parts by weight, based on a total amount of 100 parts by weight of both ingredients (A) and (B). If the amount in question is less than 0.1 part by weight, it will be impossible to let the ingredients (A) and (B) cure to a satisfactory extent, while if it exceeds 10 parts by weight, coloration of the photocurable resin composition will become conspicuous, which is not practical for sealing the organic EL device. Further, there is a fear that the storage stability may be deteriorated.

The ingredient (D) employable in the present invention is a silane coupling agent containing a glycidyl group in each molecule thereof. With use of the ingredient (D), the composition is not colored and it is possible to impart good adhesiveness to the adherend. As examples of the ingredient (D) are mentioned 3-glycidoxypropyltrimethoxysilane, 3-glycidoxypropylmethyldimethoxysilane, 3-glycidoxypropylmethyldimethoxysilane, and 2-(3,4-epoxycyclohexyl)ethyltrimethoxysilane. These silane coupling agents may be used as a mixture of two or more. Above all, 3-glycidoxypropyltrimethoxysilane is particularly superior in its compatibility with the ingredients (A) and (B) and is also superior in stability, so is employable preferably. The amount of the ingredient (D) to be added is preferably 0.1 to 10 parts by weight, more preferably 0.3 to 2 parts by weight, based on a total amount of 100 parts by weight of both ingredients (A) and (B). If the amount in question is less than 0.1 part by weight, it will be next to impossible to attain the adhesiveness improving effect, while if it exceeds 10 parts by weight, outgas will be produced during reaction, with consequent fear of a bad influence being exerted on the organic EL device.

Preferably, a solution of the above ingredients (A) to (D) in an organic solvent such as methyl ethyl ketone or toluene is applied onto a base film (release film) to a uniform thickness by means of a coating machine, followed by volatilization of the organic solvent to form a sheet (film or tape) which is solid in a normal temperature region (about 25° C.). By thus forming into a sheet shape in advance it is possible to easily effect heat transfer onto the surface of the organic EL device. Alternatively, the photocurable resin composition of the present invention may be directly applied onto a substrate formed with the organic EL device or onto a water-impermeable sealing glass substrate or a sealing film having a gas barrier property. By thus forming into a solid state in the normal temperature region it becomes possible to make a long-term storage at a low temperature. However, it is preferable that a desiccant be present during the storage in order to maintain the moisture content at a certain constant level or lower. It is desirable that the photocurable resin composition of the present invention exhibit fluidity in the temperature range of 50° to 100° C. This is because in sealing the organic EL device it is intended for the photocurable resin composition having been heat-fluidized to quickly get into concaves and convexes formed in the device surface, thereby removing bubbles. If this fluidizing temperature is lower than 50° C., the fluidity of the photocurable resin composition will increase to excess at the time of heat transfer, giving rise to problems such as the workability being deteriorated or the sheet shape being no longer retained. Further, there is a fear that it may become difficult to control the film thickness of a cured product or the storage stability before curing may be impaired. On the other hand, if the fluidizing temperature exceeds 100° C., the inclusion of bubbles may become easier because the fluidity in heat transfer is deteriorated, or the organic EL device may be affected because heating proceeds to a greater extent than necessary.

In the present invention, other known ingredients may be added within the scope not impeding the object of the present invention. For example, a storage stabilizer, a plasticizer, a viscoelasticity adjusting agent, and a filler, may be added, provided care should be exercised about the moisture content and impurities in those additives.

Effect of the Invention

As described above, by using the photocurable resin composition of the present invention for sealing an organic EL device layer formed on a glass or film substrate or for filling up, sealing and bonding the gap between an organic EL device layer formed on a glass or film substrate and a water-impermeable glass or film substrate layer, it is possible to suppress the formation and grow of dark spots, with the result that it is possible to provide an organic EL panel wherein the progress of deterioration of the organic EL device is greatly suppressed. Moreover, both heat resistance and moisture resistance are improved in comparison with sealing made by a sheet-like pressure-sensitive adhesive or thermoplastic resin not having reactivity. Further, as compared with sealing which uses a radical curing type photocurable resin composition such as an acryl functional type, there is little chemical influence on the organic EL device and the composition is low in moisture permeability. Thus, the organic EL device sealed thereby can exhibit a stable performance.

EXAMPLES

The present invention will be described below in detail by way of Examples, but it is to be understood that the invention is not limited to the following Examples.

As shown in Tables 1 and 2, various compositions were prepared and various evaluation tests were conducted. The results obtained are also given in those tables. The following ingredients were used and their proportions are on a weight basis unless otherwise mentioned.

EPICLON EXA-835LV . . . bisphenol A and F type mixed epoxy resin, low chlorine type, molecular weight 300-350, (a product of Dainippon Ink And Chemicals, Incorporated)

Epikote 152 . . . phenol novolak type epoxy resin, molecular weight about 530, (a product of jER Co.)

Epikote 1001 . . . solid bisphenol type epoxy resin, molecular weight about 900, (a product of jER Co.)

Epikote 1010 . . . solid bisphenol type epoxy resin, molecular weight about 5500, (a product of jER Co.)

YP-70 . . . phenoxy resin, molecular weight 45000-55000, (a product of Tohto Kasei Co.)

Epikote 1256 . . . phenoxy resin, molecular weight about 50000, (a product of jER Co.)

ADEKA OPTOMER SP-170 . . . 4,4-bis[di(($\beta$-hydroxyethoxy) phenylsulfonyl]phenyl sulfide-bis-hexafluoroantimonate (a product of Asahi Denka Kogyo K.K.)

PC2506 . . . diallyliodonium hexafluoroantimonate (a product of POLYSET CO.)

KBM403 . . . 3-glycidoxypropyltrimethoxysilane (a product of Shin-Etsu Chemical Co.)

KBE903 . . . 3-aminopropyltriethoxysilane (a product of Shin-Etsu Chemical Co.)

KBM503 . . . 3-methacryloxypropyltrimethoxysilane (a product of Shin-Etsu Chemical Co.)

KBE9007 . . . 3-isocyanatopropyltriethoxysilane (a product of Shin-Etsu Chemical Co.)

PLENACT KR46B . . . titanate-based coupling agent (a product of Ajinomoto Fine Techno Co.)

Examples 1-9 and Comparative Examples 1-8

As Examples 1-9 there were prepared photocurable resin compositions at such proportions as shown in Table 1. A concrete operation procedure was as follows. (1) acid photo catalysts (C) (SP-170, PC2506) were added into epoxy resins (A) (835LV, 152, 1001) and were dissolved uniformly by stirring. (2) Phenoxy resins (B) (YP-70, 1256) were dissolved in methyl ethyl ketone by stirring at a normal temperature. Then, the (1), (2) and a coupling agent (D) (KBM403) were mixed together in respective predetermined amounts, followed by stirring at a normal temperature, to afford compositions. Subsequently, with use of a coating machine, the compositions were each applied to a thickness of about 20 μm onto a PET film having been subjected to a mold release treatment, affording sheet-like samples stacked on release films respectively, the sheet-like samples being solid in the normal temperature region (about 25° C.)

Also in Comparative Examples 1-8, like the above Examples, photocurable resin compositions were prepared in such proportions as shown in Table 2. More specifically, (1) curing agent components (SP-170, 2MA-OKPW) were added into epoxy resins (A) (835LV, 1001) and were dissolved uniformly by stirring. (2) Phenoxy resins (B) (YP-70, 1256) were dissolved in methyl ethyl ketone by stirring at a normal temperature. Then, the (1), (2) and a coupling agent component (D) were mixed together in respective predetermined amounts, followed by stirring at a normal temperature, to afford compositions. Subsequently, with use of a coating machine, the compositions were each applied to a thickness of about 20 μm onto a PET film having been subjected to a mold release treatment, affording sheet-like samples stacked on release films respectively, the sheet-like samples being solid in the normal temperature region (about 25° C.)

Various evaluation tests were conducted in the following manner.

Evaluation Tests 1, 2: Flowing Start Temperature Measurement & Viscosity Measurement The sheet-like samples were each peeled off from release paper and deaerated in a five-sheet stacked state so as to give a thickness of about 100 μm (using a vacuum laminator). Then, using a rheometer (DAR-100 viscoelasticity measuring device, a product of Reologica Co.), the laminates thus formed were each heated to 25°~150° C. and a flowing start temperature in this heated condition was measured. The flowing start temperature was set at a temperature at which the value of storage elastic modulus and the value of loss elastic modulus were equal to each other (the value of tan δ becomes unity).

In the measurement using the rheometer, viscosities at 50° C. and 100° C. were recorded.

Evaluation Test 3: Outgas Measurement

The sheet-like samples prepared above were each weighed about 5 mg and measured for the amount of outgas produced on heating at 120° C. for 15 minutes in accordance with a dynamic space method using a double shock pyrolyzer and a gas chromatograph/mass spectrometer (GC-MS). The total amount of outgas produced was determined using n-decane as a standard reference material. The samples were each cured completely by being irradiated with 6000 mJ/cm² of ultraviolet light and then allowed to stand at 80° C. for 1 hour within a heat-dryer.

Evaluation Test 5: Visible Light Transmittance Measurement

A glass substrate for panel was cut to 25 mm×50 mm, then each of the sheet-like samples prepared above was transferred onto the thus-cut glass substrate and was thereafter cured completely by being irradiated with 6000 mJ/cm² of ultraviolet light and then allowed to stand at 80° C. for 1 hour within a heat-dryer. The sample pieces were each measured for the transmittance of light with use of a glass spectrophotometer.

Evaluation Test 6: Dark Spot Evaluation

A transparent electrode was formed as a 0.1 μm thick film on a glass substrate by sputtering. Then, a hole transporting layer and an organic EL layer were formed in this order each as a 0.05 μm thick film onto the transparent electrode. Thereafter, onto the glass substrate was transferred each of the above sheet-like samples by means of a roll laminator. Then, a water-impermeable glass substrate was put on the sample-transferred glass substrate and compression-bonded hereto under heating with use of a vacuum laminator. Subsequently, each of the samples was cured completely by being irradiated with 6000 mJ/cm² of ultraviolet light and then allowed to stand at 80° C. for 1 hour within a heat-dryer. In this way there was fabricated a panel, which was then observed for the formation of dark spots in an initial stage and the growth of dark spots when allowed to stand in a 60° C.×90% environment. The observation method was a visual method using an optical microscope. In the evaluation of initial-stage dark spot formation, the criterion was determined to be "accepted" when a dark spot of 20 μm or larger in diameter was not observed, while it was determined to be "rejected" when such a dark spot was observed. In the evaluation of dark spot growth, the criterion was determined to be "accepted" when a dark spot of 100 μm or larger in diameter was not observed after the lapse of 1000 hours under standing in the aforesaid environment, while it was determined to be "rejected" which such a dark spot was observed.

TABLE 1

| | | Raw Material | Example 1 | Example 2 | Example 3 | Example 4 | Example 5 | Example 6 | Example 7 | Example 8 | Example 9 |
|---|---|---|---|---|---|---|---|---|---|---|---|
| A | Low Molecular Epoxy Resin | 835LV | 25 | 25 | 25 | 25 | 25 | 25 | | 35 | 25 |
| | | 152 | | | | | | | 25 | | |
| | | 1001 | 25 | 25 | 25 | 25 | 25 | 25 | 25 | 35 | |
| | | 1010 | | | | | | | | | 25 |
| B | High Molecular Epoxy Resin | YP-70 | 50 | 50 | 50 | 50 | 50 | 50 | 50 | | 50 |
| | | 1256 | | | | | | | | 30 | |
| C | Latent Acid Photo Catalyst | SP-170 | 1.5 | 3 | 0.3 | 1.5 | 1.5 | | 1.5 | 1.5 | 1.5 |
| | | PC2506 | | | | | | 1.5 | | | |
| D | Silane Coupling Agent | KBM403 | 1 | 1 | 1 | 0.3 | 10 | 1 | 1 | 1 | 1 |
| Organic Solvent | | Methyl ethyl ketone | 200 | 200 | 200 | 200 | 200 | 200 | 200 | 200 | 200 |

| Evaluation Results | | Unit | Example 1 | Example 2 | Example 3 | Example 4 | Example 5 | Example 6 | Example 7 | Example 8 | Example 9 |
|---|---|---|---|---|---|---|---|---|---|---|---|
| Flowing Start Temp. | | °C. | 70 | 68 | 70 | 74 | 60 | 73 | 60 | 65 | 75 |
| Viscosity | 50° C. | Pa·s | 4950 | 4800 | 4960 | 5050 | 3200 | 4800 | 6000 | 3370 | 6790 |
| | 100° C. | | 400 | 430 | 410 | 440 | 455 | 450 | 550 | 120 | 580 |
| Moisture Content | | ppm | 970 | 1400 | 770 | 850 | 1310 | 1280 | 1380 | 1110 | 1370 |
| Outgas Measurement | | ppm | 220 | 440 | 140 | 100 | 950 | 190 | 250 | 180 | 370 |
| Visible Light Transmittance Measurement | | % | 95 | 95 | 95 | 95 | 95 | 94 | 93 | 97 | 96 |
| Initial-stage Dark Spot Formation | | — | Accepted | Accepted | Accepted | Accepted | Accepted | Accepted | Accepted | Accepted | Accepted |
| Dark Spot Growth | | — | Accepted | Accepted | Accepted | Accepted | Accepted | Accepted | Accepted | Accepted | Accepted |

TABLE 2

| | | Raw Material | Comparative Example 1 | Comparative Example 2 | Comparative Example 3 | Comparative Example 4 | Comparative Example 5 |
|---|---|---|---|---|---|---|---|
| A | Low Molecular Epoxy Resin | 835LV | 40 | 25 | 25 | 25 | 25 |
| | | 1001 | 40 | | 25 | 25 | 25 |
| B | High Molecular Epoxy Resin | YP-70 | 20 | | | 50 | 50 |
| | | 1256 | | 75 | 50 | | |
| C | Curing Agent Component | SP-170 | 1.5 | 1.5 | 15 | 0.05 | |
| | | 2MA-OKPW | | | | | 1.5 |
| D | Coupling Agent | KBM403 | 1 | 1 | 1 | 1 | 1 |
| | | KBE903 | | | | | |
| | | KBE503 | | | | | |
| | | KBE9007 | | | | | |
| | | KR46B | | | | | |
| Organic Solvent | | Methyl ethyl ketone | 200 | 200 | 200 | 200 | 200 |

| Evaluation Results | Unit | Comparative Example 1 | Comparative Example 2 | Comparative Example 3 | Comparative Example 4 | Comparative Example 5 |
|---|---|---|---|---|---|---|
| Flowing Start Temp. | ° C. | 40 | 120 | 70 | 68 | 65 |
| Viscosity   50° C. | Pa · s | 360 | 8500 | 5700 | 4850 | 5000 |
| 100° C. | | less than 5 | 3000 | 500 | 420 | 450 |
| Moisture Content | ppm | 1200 | 1100 | 1060 | 1075 | 1250 |
| Outgas Measurement | ppm | 330 | 500 | 1980 | 40 | 1620 |
| Visible Light Transmittance Measurement | % | 90 | 92 | 83 | 95 | 95 |
| Initial-stage Dark Spot Formation | — | Rejected | Rejected | Rejected | Accepted | Rejected |
| Dark Spot Growth | — | Rejected | Rejected | Rejected | Rejected | Accepted |

| | | Comparative Example 6 | Comparative Example 7 | Comparative Example 8 | Comparative Example 9 | Comparative Example 10 | Comparative Example 11 |
|---|---|---|---|---|---|---|---|
| A | Low Molecular Epoxy Resin | 25 | 25 | 25 | 25 | 25 | 25 |
| | | 25 | 25 | 25 | 25 | 25 | 25 |
| B | High Molecular Epoxy Resin | 50 | 50 | 50 | 50 | 50 | 50 |
| C | Curing Agent Component | 1.5 | 1.5 | 1.5 | 1.5 | 1.5 | 1.5 |
| D | Coupling Agent | — | 15 | | | | |
| | | | | 1 | | | |
| | | | | | 1 | | |
| | | | | | | 1 | |
| | | | | | | | 1 |
| Organic Solvent | | 200 | 200 | 200 | 200 | 200 | 200 |
| Evaluation Results | | | | | | | |
| Flowing Start Temp. | | 70 | 45 | 71 | 68 | 73 | 72 |
| Viscosity   50° C. | | 5010 | 3890 | 5080 | 5150 | 5220 | 4930 |
| 100° C. | | 460 | 250 | 470 | 570 | 620 | 510 |
| Moisture Content | | 980 | 1990 | 1100 | 930 | 1110 | 1080 |
| Outgas Measurement | | 50 | 2840 | 250 | 460 | 550 | 770 |
| Visible Light Transmittance Measurement | | 95 | 95 | 78 | 93 | 92 | 87 |
| Initial-stage Dark Spot Formation | | Rejected | Rejected | Rejected | Rejected | Rejected | Rejected |
| Dark Spot Growth | | Rejected | Rejected | Rejected | Rejected | Rejected | Rejected |

In each of Examples 1 to 18 there was neither formation of dark spots in an initial stage nor growth of dark spots, but good evaluation results were obtained. In Example 9, because of a relatively high content of high molecular components, the sheet surface before curing was somewhat poor in tackiness and a slight difficulty was recognized in for example alignment for the adherend. However, there was no problem in physical properties after curing.

In Comparative Example 1, because of an excessive proportion of the ingredient (A), the flowing start temperature was low and consequently it was impossible to retain the shape at the time sealing. Besides, inclusion of bubbles made it impossible to fully exhibit the sealing performance, nor was it possible to suppress the formation and growth of dark spots. Further, in the coating step of forming in a sheet shape, it was difficult to form a uniform film.

In Comparative Example 2, because of an excessive proportion of the ingredient (B), the flowing start temperature became too high and it was impossible to wet the adherend to a satisfactory extent. As is the case with Comparative Example 1, the sealing performance cannot be exhibited fully, nor was it possible to suppress the formation and grow of dark spots. Further, the film became hard and fragile and the workability was deteriorated.

In Comparative Example 3, because of an excessive proportion of the curing agent (C), a large amount of outgas was produced and dark spots were formed just after sealing and also thereafter. Moreover, under the influence of the outgas it was impossible to suppress the growth of dark spots. Additionally, conspicuous coloration and deteriorated visible light transmittance resulted under the influence of the curing agent.

In Comparative Example 4, the proportion of the curing agent (C) was too small, so in a standing state after initial-stage curing the reaction stopped without progress of curing. Thus, although the formation of dark spots in an initial stage could be suppressed, it was impossible in the standing state to fully prevent the entry of foreign matters, e.g., moisture, and suppress the growth of dark spots.

In only Comparative Example 5 evaluation was made using an imidazole compound as an epoxy latent heat curing agent in place of the ingredient (C), there was performed curing by a heating process. Thus, in this evaluation test, sealing is made using the resin composition without using an inorganic protective film for protecting the device, so in the curing by the heating process the influence on the device became more conspicuous and a part of the device was found damaged. Further, the formation of outgas was allowed by outgas as a decomposition product of the above imidazole compound, but in a high temperature environment the sealing became strong and the growth of dark spots could be suppressed because the curing reaction proceeded more rapidly than the entry of moisture or the like from the exterior.

In Comparative Example 6 evaluation was made without using the ingredient (D). As a result, the composition could not ensure adhesiveness not only in an initial stage but also with the lapse of time and the entry of a foreign matter such as moisture was allowed from the gap between laminated surfaces. It was impossible to suppress the formation and growth of dark spots.

In Comparative Example 7, because of an excessive proportion of the ingredient (D), the proportion of liquid ingredients in the composition became large, resulting in lowering of the flowing start temperature. Besides, under the influence of moisture and decomposition product contained in those ingredients it was impossible to suppress the formation and growth of dark spots. Further, the surface of a sheet-like sample became extremely sticky and the workability was poor.

In Comparative Examples 8 to 10 evaluation was made using an amine functional silane coupling agent, an acryl functional silane coupling agent, and an isocyanate functional silane coupling agent, respectively, in place of the ingredient (D). As a result, those coupling agents were poor in compatibility with the ingredients (A) and (B) and a satisfactory adhesiveness could not be exhibited not only in an initial stage but also with the lapse of time, nor was it possible to suppress the formation and growth of dark spots. Besides, in the compositions not cured yet, KBE903 and KBM503 were poor in compatibility with the ingredients (A) and (B) and there occurred bleeding-out of those coupling agents, giving rise to the problem that stirring must be done every time they are used. Also as to KBE9007, in the associated composition not cured yet, a portion thereof reacts with the ingredients (A) and (B), giving rise to the problem that there occurred gelation in a storage vessel when it is stored in an unused state over a long period of time.

In Comparative 11 evaluation was made using a titanate-based coupling agent in place of the ingredient (D). As a result, this coupling agent was very poor in compatibility with the ingredients (A) and (B) and the associate composition scarcely exhibited any adhesiveness to the adherend. Besides, the coupling agent in question was suspended within the composition and the visible light transmittance was deteriorated.

INDUSTRIAL APPLICABILITY

The photocurable resin composition of the present invention is employable not only for sealing an organic EL device but also as a sealing material exerting little thermal influence on various electronic parts and superior in sealing performance.

The invention claimed is:

1. A method of sealing an organic EL device using a photocurable resin composition for sealing an organic EL device for use in a light source or a display device, which essentially consists of (A) an epoxy resin containing at least two glycidyl groups in each molecule thereof and having a molecular weight of 200 to 7000, (B) an epoxy resin containing at least one glycidyl group in each molecule thereof and having a molecular weight of 20000 to 100000, (C) a latent acid photo catalyst adapted to be activated and produce an acid upon being irradiated with energy beam, and (D) a silane coupling agent containing a glycidyl group in each molecule thereof,
    wherein the amount of the ingredient (B) is 30 to 150 parts by weight based on 100 parts by weight of the ingredient (A), and the amount of the ingredient (C) is 0.1 to 10 parts by weight and that of the ingredient (D) is 0.3 to 2 parts by weight based on a total amount of 100 parts by weight of both the ingredients (A) and (B), and
    wherein the photocurable resin composition exhibits non-fluidity at 25° C., while it exhibits fluidity in a range of temperature from 50 to 100° C., and has a viscosity equal to or greater than 10 Pa·s at 100° C.,
    the method comprising the steps of:
    transferring the photocurable resin composition for sealing an organic EL device onto a glass or film substrate on which an organic EL device is formed or a sealing glass or film, superimposing the glass or film substrate on which the organic EL device is formed and the sealing glass or film so as to sandwich the transferred photocurable resin composition for sealing an organic EL device, and then temporarily fixing the glass or film substrate on which the organic EL device is formed and the sealing glass or film by compression-bonding under heating; and
    irradiating ultraviolet light to the photocurable resin composition for sealing an organic EL device included in the temporarily fixed substrate to cure the photocurable resin composition for sealing an organic EL device.

2. A method as set forth in claim 1, wherein the photocurable resin composition for sealing an organic EL device is formed in a sheet shape by coating a solution of the ingredients (A) to (D) in an organic solvent with a uniform thickness onto a base film, and then volatilizing the organic solvent.

3. A method as set forth in claim 1, wherein the photocurable resin composition for sealing an organic EL device has a moisture content of lower than 1500 ppm.

4. A method as set forth in claim 1, wherein the photocurable resin composition for sealing an organic EL device when cured to a thickness of 20 μm and left standing at 120° C. for 15 minutes produces outgas in the unit of μg/cm$^2$ of smaller than 1000 ppm.

5. A method as set forth in claim 1, wherein the photocurable resin composition for sealing an organic EL device when cured to a thickness of 20 μm has a 405 nm wavelength visible light transmittance of not less than 90%.

6. A method as set forth in claim 1, wherein the viscosity is equal to or greater than 100 Pa·s.

7. A photocurable resin composition for sealing an organic EL device for use in a light source or a display device, wherein the photocurable resin composition contains, (A) an epoxy resin containing at least two glycidyl groups in each molecule thereof and having a molecular weight of 200 to 7000, (B) an epoxy resin containing at least one glycidyl group in each molecule thereof and having a molecular weight of 20000 to 100000, (C) a latent acid photo catalyst adapted to be activated and produce an acid upon being irradiated with energy beam, and (D) a silane coupling agent containing a glycidyl group in each molecule thereof, wherein the amount of the ingredient (B) is 30 to 150 parts by weight based on 100 parts by weight of the ingredient (A), and the amount of the ingredient (C) is 0.1 to 10 parts by weight and that of the ingredient (D) is 0.3 to 2 parts by weight based on a total amount of 100 parts by weight of both the ingredients (A) and (B), and wherein the photocurable resin composition exhibits non-fluidity at 25° C., while exhibits fluidity in a range of temperature from 50 to 100° C., and has a viscosity equal to or greater than 10 Pa·s at 100° C.

8. The photocurable resin composition for sealing the organic EL device as set forth in claim 7, wherein a moisture content of the photocurable resin composition for sealing the organic EL device is lower than 1500 ppm.

9. The photocurable resin composition for sealing the organic EL device as set forth in claim 7, wherein when the photocurable resin composition for sealing the organic EL device is cured to a thickness of 20 μm and left standing at 120° C. for 15 minutes, outgas is produced in the unit of μg/cm$^2$ of smaller than 1000 ppm.

10. The photocurable resin composition for sealing the organic EL device as set forth in claim 7, wherein when the photocurable resin composition for sealing the organic EL device is cured to a thickness of 20 μm, a transmittance of 405 nm wavelength visible light is not less than 90%.

11. The photocurable resin composition for sealing the organic EL device as set forth in claim 7, wherein the viscosity thereof is equal to or greater than 100 Pa·s.

* * * * *